(12) United States Patent
Koyama (10) Patent No.: US 8,710,534 B2
(45) Date of Patent: Apr. 29, 2014

(54) SEMICONDUCTOR LIGHT-RECEIVING DEVICE (71) Applicant: Sumitomo Electric Device Innovations, Inc., Yokohama (JP)

(72) Inventor: Yuji Koyama, Yokohama (JP)

(73) Assignee: Sumitomo Electric Device Innovations, Inc., Yokohama-shi, Kanagawa (JP)

(*) Notice: Subject to any disclaimer, the term of this patent is extended or adjusted under 35 U.S.C. 154(b) by 0 days.

(21) Appl. No.: 13/747,050

(22) Filed: Jan. 22, 2013

(65) Prior Publication Data

US 2013/0187181 A1  Jul. 25, 2013

(30) Foreign Application Priority Data

Jan. 20, 2012 (JP) .................................. 2012-009737
Dec. 27, 2012 (JP) .................................. 2012-285307

(51) Int. Cl.
*H01L 33/58* (2010.01)
*H01L 31/0232* (2006.01)

(52) U.S. Cl.
USPC ...... 257/98; 257/432; 257/433; 257/E31.121; 257/E33.068

(58) Field of Classification Search
USPC ............. 257/98, 432, 433, E31.121, E33.068
See application file for complete search history.

(56) References Cited

U.S. PATENT DOCUMENTS 6,721,101 B2 * 4/2004 Daniell ......................... 359/626
2011/0089515 A1 4/2011 Koyama

FOREIGN PATENT DOCUMENTS

JP 2011-091139 A 5/2011

* cited by examiner

*Primary Examiner* — Minh-Loan T Tran
(74) *Attorney, Agent, or Firm* — Westerman, Hattori, Daniels & Adrian, LLP (57) ABSTRACT A semiconductor light-receiving device includes two lenses; and a concave region, a height of the sidewall being higher than a top of the lenses, a distance between a position H and a lower edge of the sidewall vertical to a line segment C1 being grater than following condition: $\{(r+L)^2-(W/2)^2\}^{1/2}$ where: C1 is a line segment connecting centers of the lenses; H is a midpoint of the C1; r is a radius of the lenses; W is an interval between the centers; and C2 is a lines passing through the centers in a direction vertical to the C1, wherein: the lower edge of the concave portion in an outer side of a region between the C2 is concentrically formed so as to have a distance of (r+L) from the center of the lenses; and W is following condition: W<2 (r+L).

12 Claims, 13 Drawing Sheets

FIG. 1A

FIRST COMPARATIVE EXAMPLE

FIG. 1B

LIGHT-RECEIVING PORTION

FIG. 2A

SECOND COMPARATIVE EXAMPLE

FIRST EMBODIMENT

SEMICONDUCTOR LIGHT-RECEIVING DEVICE

CROSS-REFERENCE TO RELATED APPLICATION

This application is based upon and claims the benefit of priority of the prior Japanese Patent Applications No. 2012-009737, filed on Jan. 20, 2012 and No. 2012-285307, filed on Dec. 27, 2012, the entire contents of which are incorporated herein by reference.

BACKGROUND (i) Technical Field

The present invention relates to a semiconductor light-receiving device.

(ii) Related Art

Japanese Patent Application Publication No. 2011-91139 discloses a back-illuminated light-receiving element in which a lens is formed on a back face. In a chip in which a plurality of light-receiving elements are provided, it is necessary that the number of the light-receiving element is the same as that of the lens.

SUMMARY

After forming a plurality of lenses, an insulating film is formed so as to cover the lenses. In this case, a defect of the insulating film may occur.

It is an object to restrain a trouble such as a defect of an insulating film of a semiconductor light-receiving device having a plurality of back-illuminated light-receiving elements.

According to an aspect of the present invention, there is provided a semiconductor light-receiving device including two lenses provided on a semiconductor substrate; and a concave region surrounding the two lenses, a sidewall positioned along an edge of the concave region having an upper edge and a lower edge, a height of the sidewall being higher than a top of the lenses, a distance between a position H and the lower edge of the sidewall in a direction vertical to a line segment C1 being grater than following condition (1): $\{(r+L)^2-(W/2)^2\}^{1/2}$ where: C1 is a line segment connecting centers of the two lenses; H is a midpoint of the line segment C1; r is a radius of the lenses; W is an interval between the centers of the two lenses; and C2 is a lines passing through the centers of the lenses in a direction vertical to the line segment C1, wherein: the lower edge of the concave portion in an outer side of a region between the lines C2 is concentrically formed so as to have a distance of (r+L) from the center of the lenses; and W is following condition (2): $W<2(r+L)$.

According to another aspect of the present invention, there is provided a semiconductor light-receiving device including two lenses provided on a side of the lower face of the substrate; and a concave region surrounding the two lenses, a sidewall positioned along an edge of the concave region having an upper edge and a lower edge, a height of the sidewall being higher than a top of the lenses, a distance between a position H and the lower edge of the sidewall in a direction vertical to a line segment C1 being greater than following condition (1): $\{(r+L)^2-(W/2)^2\}^{1/2}$ where: C1 is a line segment connecting centers of the two lenses; H is a midpoint of the line segment C1; r is a radius of the lenses; W is an interval between the centers of the two lenses; and C2 is a lines passing through the centers of the lenses in a direction vertical to the line segment C1, wherein: the lower edge of the concave portion in an outer side of a region between the lines C2 is concentrically formed so as to have a distance of (r+L) from the center of the lenses; and W is following condition (2): $W<2(r+L)$.

DETAILED DESCRIPTION

A description will be given of comparative examples before a description of embodiments.

First Comparative Example

Figure 1A:
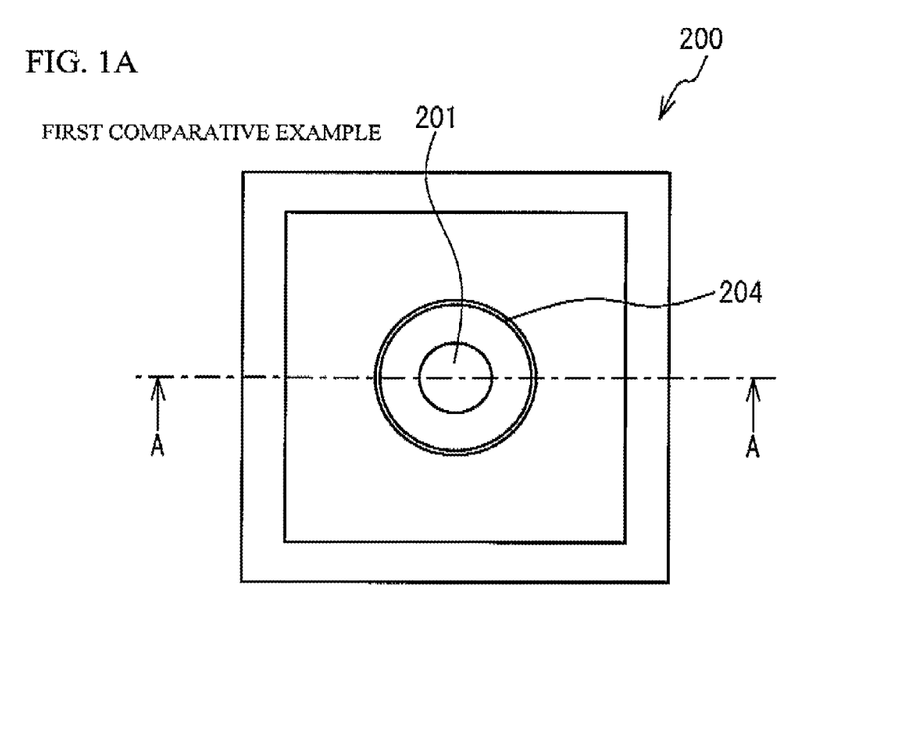
FIG. 1A illustrates a plane view of a back face side of a semiconductor light-receiving device in accordance with a first comparative example.
Figure 1B:
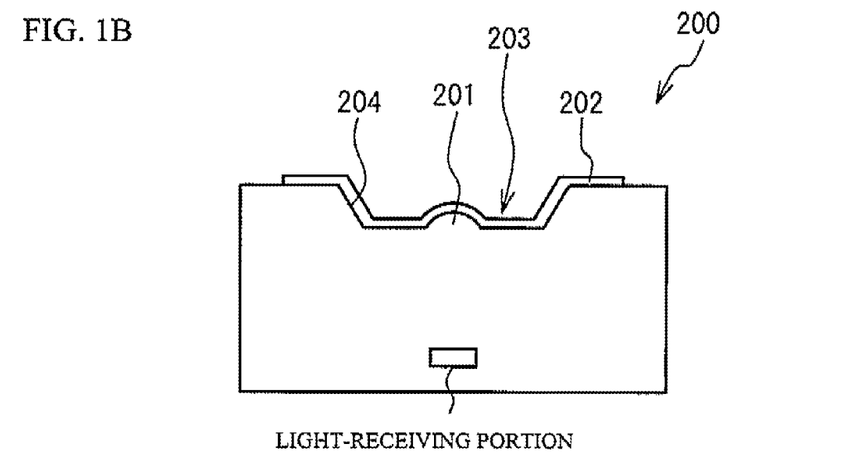
FIG. 1B illustrates a cross sectional view taken along a line A-A of FIG. 1A.

FIG. 1A illustrates a plane view of a back face side (light incidence side) of a semiconductor light-receiving device 200 in accordance with a first comparative example. FIG. 1B illustrates a cross sectional view taken along a line A-A of FIG. 1A. As illustrated in FIG. 1A and FIG. 1B, a lens 201 for focusing on a light-receiving portion is formed on the back face of the semiconductor light-receiving device 200. An insulating film 202 is formed on an exposed face of the lens 201.

The lens 201 is formed by grinding the back face of the semiconductor light-receiving device 100 by a milling or the like. A concave region 203 is formed around the lens 201. A sidewall 204 is formed so as to face with an outer circumference of the lens 201 when the concave region 203 is formed around the lens 201.

The concave region 203 has a concentric shape with respect to the lens 201. Thereby, when the semiconductor light-receiving device 200 is viewed from the back face side thereof, the outer circumference of the lens 201 and the sidewall 204 of the concave region 203 form a double circle as illustrated in FIG. 1A.

Figure 2A:
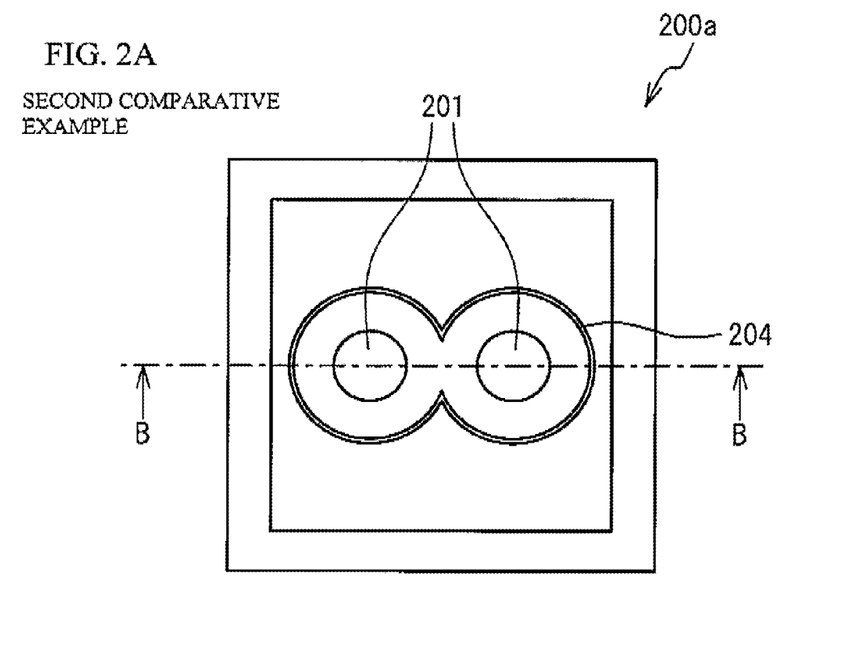
FIG. 2A illustrates a plane view of a back face side of a semiconductor light-receiving device in accordance with a second comparative example.
Figure 2B:
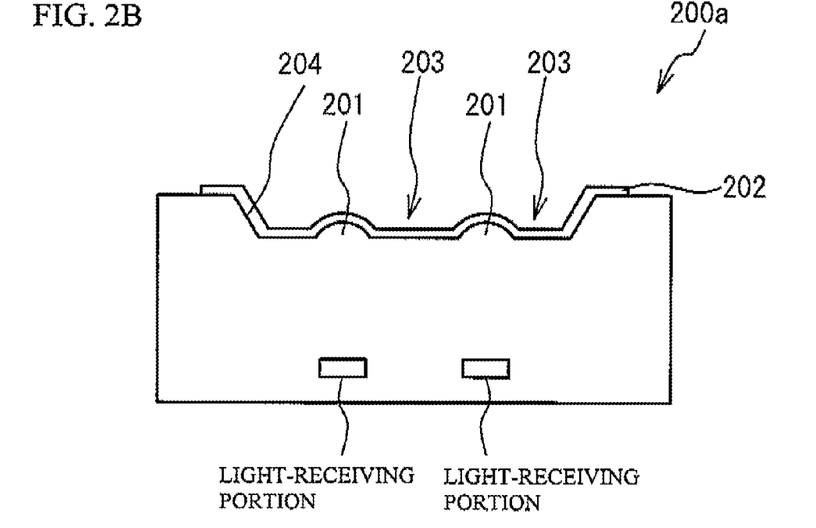
FIG. 2B illustrates a cross sectional view taken along a line B-B of FIG. 2A.

FIG. 2A illustrates a plane view of a back face side (light incidence side) of a semiconductor light-receiving device 200a in accordance with a second comparative example. FIG. 2B illustrates a cross sectional view taken along a line B-B of FIG. 2A. The semiconductor light-receiving device 200a has two light-receiving portions on an upper face side. As illustrated in FIG. 2A and FIG. 2B, two lenses 201 are formed according to the two light-receiving portions on the back face of the semiconductor light-receiving device 200a. The insulating film 202 is formed so as to cover the two lenses 201.

As illustrated in FIG. 2A, when the two light-receiving portions are adjacent to each other, two circles formed by the sidewalls 204 of the concave regions 203 of the lenses 201 overlap with each other between the two lenses 201. That is, there is no sidewall 204 separating the two lenses 201 between the two lenses 201. In this case, a part where two sidewalls 204 of the concave regions 203 surrounding the lenses 201 meet with each other projects toward between the lenses 201. That is, the sidewalls 204 of the concave regions 203 surrounding the lenses 201 projects toward between the two lenses 201 with a small angle.

In a step of forming the insulating film 202 after forming the lens 201 in the semiconductor light-receiving device 200a, a resist is coated on the back face of the semiconductor light-receiving device 200a. In this case, discontinuity of level difference may occur in a region where the sidewalls 204 of the concave regions 203 surrounding the lenses 201 meet with each other. The discontinuity of level difference means that a region on which a resist is not coated occurs. This is because the sidewalls 204 of the two concave regions 203 surrounding the two lenses 201 project toward between the two lenses 201 with a small angle.

Figure 3:
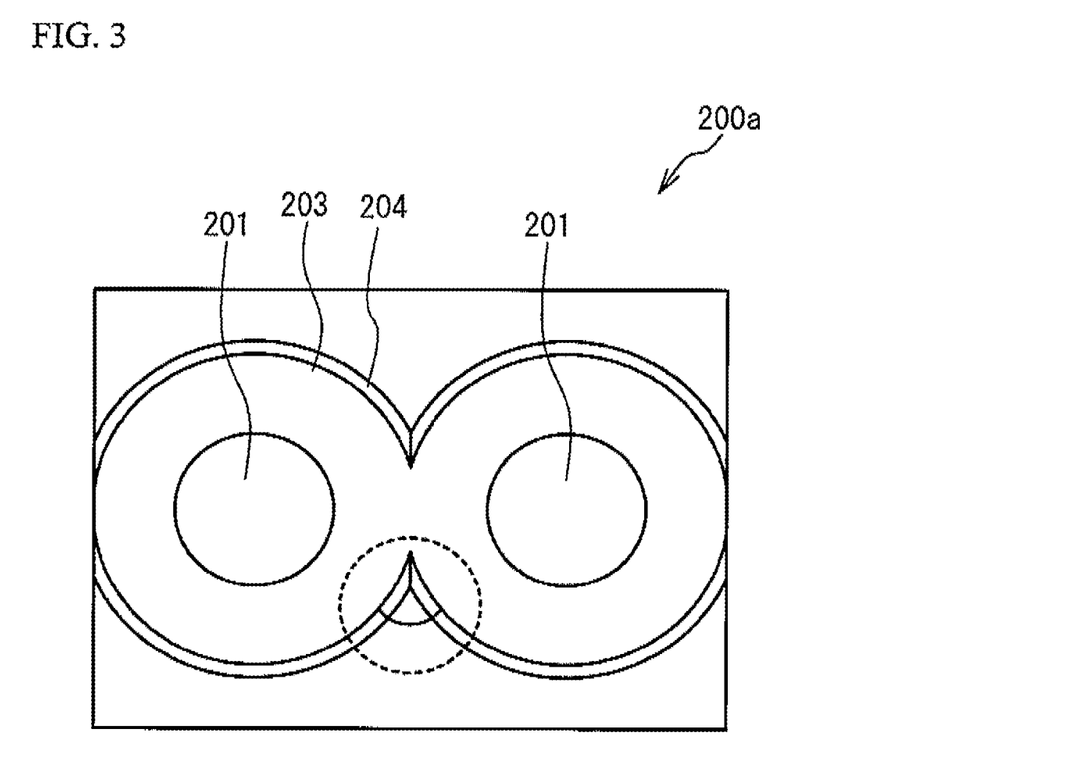
FIG. 3 illustrates a case where a resist is coated so as to cover a lens of a semiconductor light-receiving device.

FIG. 3 illustrates a case where the lens 201 is formed in the semiconductor light-receiving device 200a. After that, the insulating film 202 (not illustrated) is formed on a whole area. In this case, a region surrounded by a broken line in FIG. 3 projects with a small angle. Therefore, a defect may occur in the insulating film 202. The defect of the insulating film 202 may cause a generation of a particle. Hereinafter, a description will be given of embodiments restraining the defect of the insulating film 202.

First Embodiment

Figure 4:
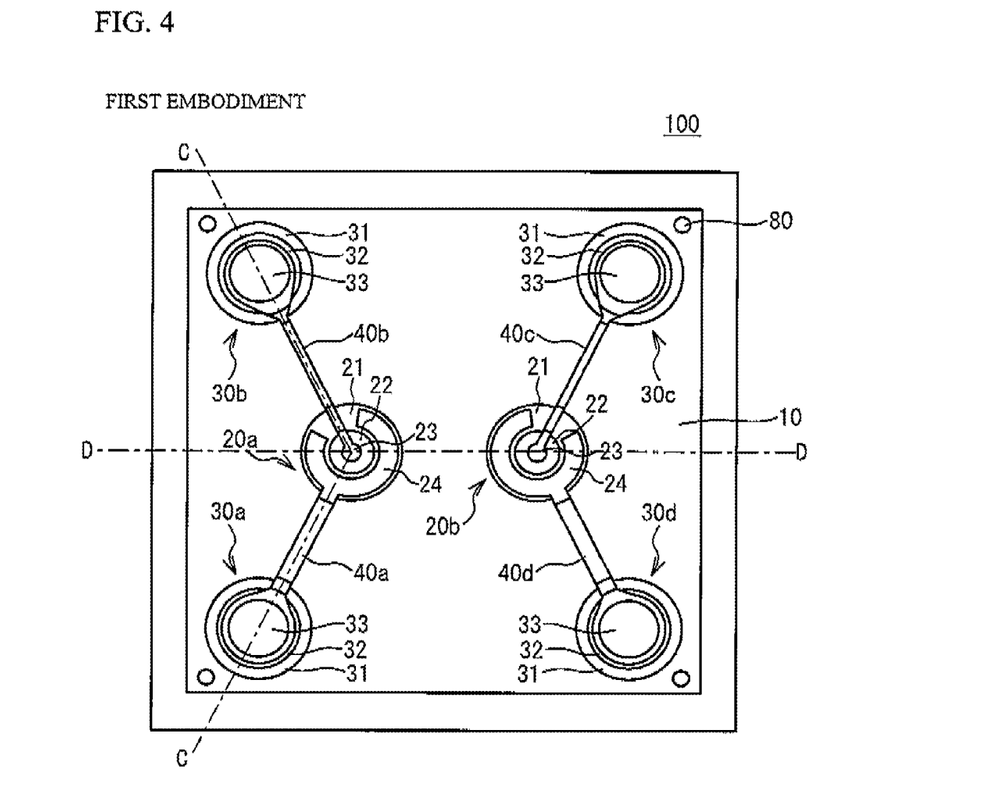
FIG. 4 illustrates a plane view of a semiconductor light-receiving device in accordance with a first embodiment.

FIG. 4 illustrates a plane view of a semiconductor light-receiving device 100 in accordance with a first embodiment viewed from a front face side. A lens 11 is formed on a back face side. As illustrated in FIG. 4, the semiconductor light-receiving device 100 has a structure in which light-receiving elements 20a and 20b and dummy mesas 30a to 30d are provided on an upper face side (opposite to the back face) of a semiconductor substrate 10. The light-receiving elements 20a and 20b and the dummy mesas 30a to 30d are independent of each other and have a mesa shape. The light-receiving eminent 20a and the light-receiving element 20b are adjacent to each other. The semiconductor light-receiving device 100 has a chip region and scribed regions around the chip region. An alignment mark 80 is formed on a corner of the chip region.

The light-receiving elements 20a and 20b have a structure in which an upper mesa 22 and an upper electrode 23 are provided on a lower mesa 21 in this order. For example, the lower mesa 21 has a circular cylinder shape. The upper mesa 22 has a circular cylinder shape having a diameter smaller than the lower mesa 21, and is arranged on a center of the lower mesa 21. The upper mesa 22 acts as a light-receiving region. The upper electrode 23 has a circular cylinder shape having a diameter smaller than the upper mesa 22, and is arranged on a center of the upper mesa 22. That is, the light-receiving elements 20a and 20b have a mesa shape whose diameter is larger at lower portion and is smaller at upper portion. Further, the light-receiving elements 20a and 20b have a lower electrode 24 on the lower mesa 21 except for the upper mesa 22. In the first embodiment, the upper electrode 23 acts as a p-side electrode, and the lower electrode 24 acts as an n-side electrode.

The dummy mesas 30a to 30d have a structure in which an upper mesa 32 and an upper electrode 33 are provided on a lower mesa 31 in this order. For example, the lower mesa 31 has a circular cylinder shape. The upper mesa 32 has a circular cylinder shape having a diameter smaller than the lower mesa 31, and is arranged on a center of the lower mesa 31. The upper electrode 33 has a circular cylinder shape having a diameter smaller than the upper mesa 32 and is arranged on a center of the upper mesa 32. That is, the dummy mesas 30a to 30d have a mesa shape whose diameter is larger at lower portion and is smaller at upper portion. The dummy mesas 30a to 30d do not act as a light-receiving element.

The upper electrode 33 of the dummy mesa 30a is coupled to the lower electrode 24 of the light-receiving element 20a by a wiring 40a going through a surface of the dummy mesa 30a, an upper face of the semiconductor substrate 10, and a surface of the light-receiving element 20a. The upper electrode 23 of the light-receiving element 20a is coupled to the upper electrode 33 of the dummy mesa 30b by a wiring 40b going through the surface of the light-receiving element 20a, the upper face of the semiconductor substrate 10, and a surface of the dummy mesa 30b.

The upper electrode 33 of the dummy mesa 30c is coupled to the upper electrode 23 of the light-receiving element 20b by a wiring 40c going through a surface of the dummy mesa 30c, the upper face of the semiconductor substrate 10, and a surface of the light-receiving element 20b. The lower electrode 24 of the light-receiving element 20b is coupled to the upper electrode 33 of the dummy mesa 30d by a wiring 40d going through the surface of the light-receiving element 20b, the upper face of the semiconductor substrate 10, and the surface of the dummy mesa 30c.

The surface of the light-receiving elements 20a and 20b, the surface of the dummy mesas 30a to 30d, and the upper face of the semiconductor substrate 10 are covered by an insulating film such as silicon nitride (SiN). The wirings 40a to 40d are provided on the insulating film. Thus, each wiring is insulated from the light-receiving elements 20a and 20b, the dummy mesas 30a to 30d and the semiconductor substrate 10.

Figure 5:
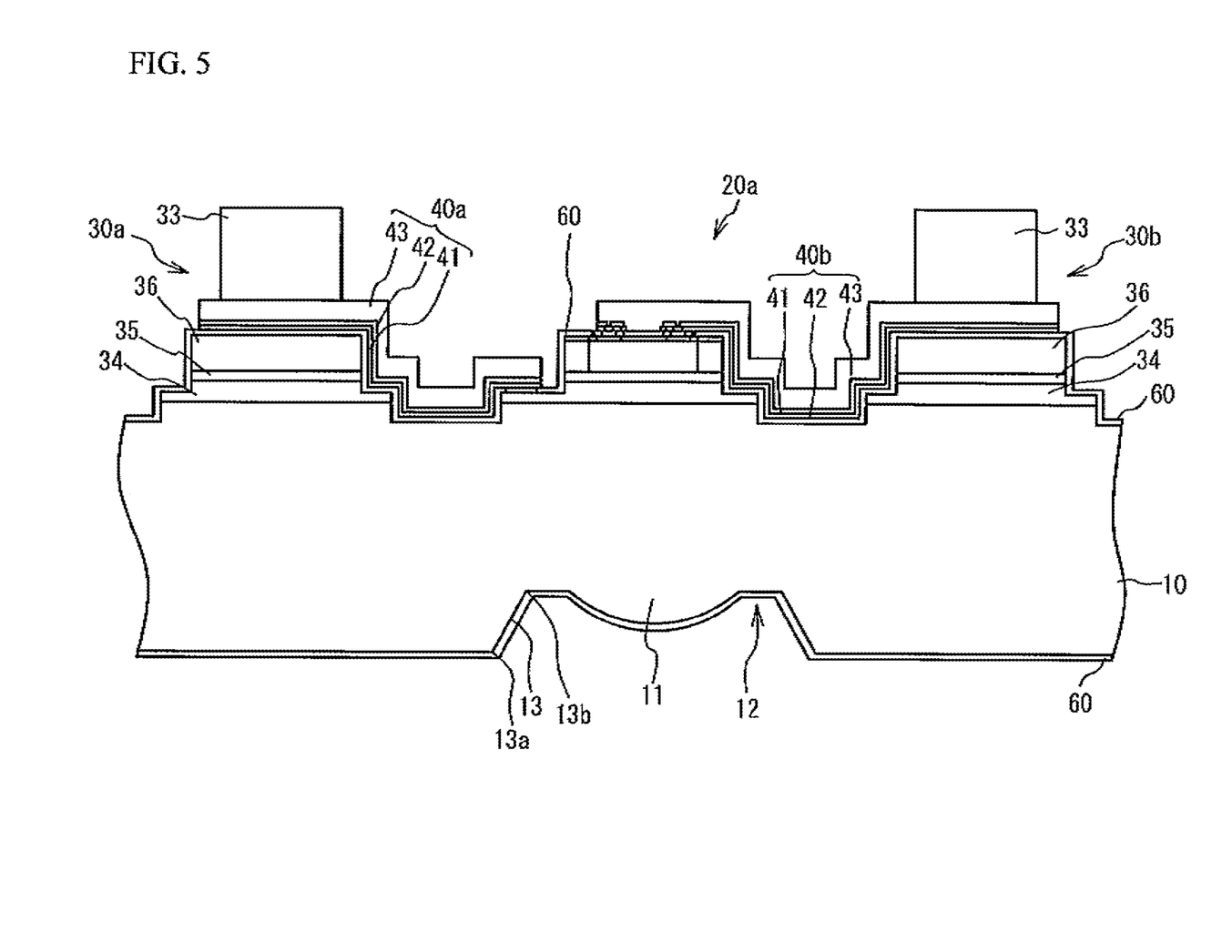
FIG. 5 illustrates a cross sectional view taken along a line C-C of FIG. 4.
Figure 6:
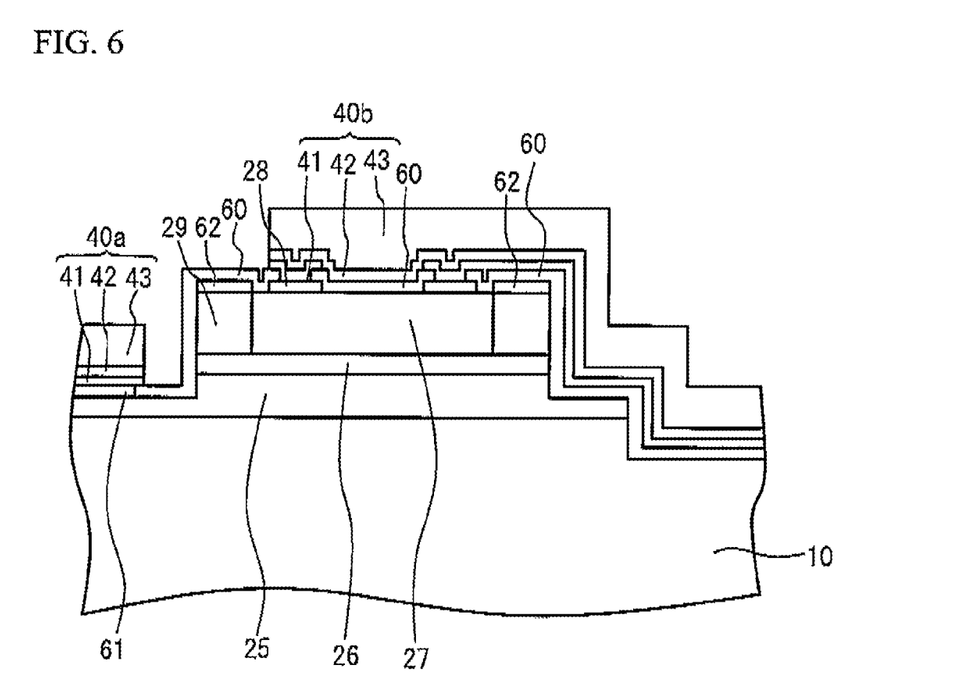
FIG. 6 illustrates an enlarged cross sectional view of a light-receiving element.

FIG. 5 illustrates a cross sectional view taken along a line C-C of FIG. 4. FIG. 6 illustrates an enlarged cross sectional view of the light-receiving element 20a. As illustrated in FIG. 5 and FIG. 6, the light-receiving element 20a has a structure in which an n-type semiconductor layer 25, an i-type semiconductor layer 26, a p-type semiconductor layer 27 and a contact layer 28 are provided on the semiconductor substrate 10 in this order. The n-type semiconductor layer 25 is, for example, made of n-type InP. The i-type semiconductor layer 26 is, for example, made of i-type InGaAs. The p-type semiconductor layer 27 is, for example, made of p-type InP. The thickness of the n-type semiconductor layer 25 is, for example, 1.0 μm. The thickness of the i-type semiconductor layer 26 is, for example, 1.0 μm. The thickness of the p-type semiconductor layer 27 is, for example, 1.0 μm.

The p-type semiconductor layer 27 has a diameter smaller than the i-type semiconductor layer 26. An n-type semiconductor layer 29 is provided on the side face of the p-type semiconductor layer 27 on the i-type semiconductor layer 26. The n-type semiconductor layer 29 is, for example, made of n-type InP. The semiconductor substrate 10 is made of a semi-insulated semiconductor and has resistivity of $2.2 \times 10^7$ Ωcm to $6.6 \times 10^7$ Ωcm. As an example, the semiconductor substrate 10 is made of semi-insulated InP. The contact layer 28 is, for example, made of p-type InGaAs. The lower mesa 21 of FIG. 4 includes the n-type semiconductor layer 25. The upper mesa 22 of FIG. 4 includes a part of the n-type semiconductor layer 25, the i-type semiconductor layer 26, the p-type semiconductor layer 27, the contact layer 28 and the n-type semiconductor layer 29. The light-receiving element 20b has the same structure as the light-receiving element 20a.

The lens 11 is formed at regions according to the light-receiving elements 20a and 20b on the back face of the semiconductor substrate 10. The lens 11 focuses an incident light from the back face of the semiconductor substrate 10 on the light-receiving elements 20a and 20b. The lens 11 can be formed by performing a milling on the semiconductor substrate 10. A concave region 12 is formed during the forming of the lens 11 around the lens 11. When the concave region 12 is formed, a sidewall 13 is formed so as to face with an outer circumference of the lens 11. The sidewall 13 has an upper edge 13a and a lower edge 13b. A top of the lens 11 is positioned at lower than the back face of the semiconductor substrate 10. Thereby, the top of the lens 11 does not project from the back face of the semiconductor substrate 10. Thus, a damage of the lens 11 is restrained. For example, a height of the lens 11 is 10 μm. And, a height of the sidewall 13 of the concave region 12 is 20 μm.

The dummy mesas 30a and 30b have a structure in which an n-type semiconductor layer 34, an i-type semiconductor layer 35 and an n-type semiconductor layer 36 are provided on the semiconductor substrate 10 in this order. The n-type semiconductor layer 34 is, for example, made of n-type InP. The i-type semiconductor layer 35 is, for example, made of i-type InGaAs. The n-type semiconductor layer 36 is, for example, made of n-type InP. The lower mesa 31 of FIG. 4 includes the n-type semiconductor layer 34. The upper mesa 32 of FIG. 4 includes a part of the n-type semiconductor layer 34, the i-type semiconductor layer 35 and the n-type semiconductor layer 36. The dummy mesas 30c and 30d have the same structure as the dummy mesas 30a and 30b.

An insulating film 60 is, for example, made of silicon nitride (SiN) and covers the surface of the light-receiving elements 20a and 20b, the surface of the dummy mesas 30a to 30d, the upper face of the semiconductor substrate 10 and the back face of the semiconductor substrate 10. A diffusion mask 62 is provided between the upper face of the n-type semiconductor layer 29 and the insulating film 60. The diffusion mask 62 is, for example, made of silicon nitride (SiN) and has a thickness of 0.2 μm or the like. The wirings 40a and 40b have a structure in which a Ti/Pt layer 41, an Au sputtering layer 42, and an Au coating layer 43 are laminated in this order from the semiconductor substrate 10 side, and is provided on the insulating film 60. Thus, the wirings 40a and 40b are insulated from the light-receiving element 20a, the dummy mesas 30a and 30b and the semiconductor substrate 10. The thickness of the insulating film 60 is, for example, 0.2 μm. The thickness of the wirings 40a and 40b is, for example, 2.0 μm. The wirings 40c and 40d have the same structure as the wirings 40a and 40b.

The insulating film 60 has an opening on the contact layer 28. Thus, the contact layer 28 of the light-receiving element 20a is contact to the wiring 40b. Similarly, the contact layer 28 of the light-receiving element 20b is contact to the wiring 40d. The insulating film 60 has an opening on the lower mesa 21 except for the upper mesa 22. A contact layer 61 is formed in the opening of the lower mesa 21. Thus, the n-type semiconductor layer 25 of the light-receiving element 20a is contact to the wiring 40a through the contact layer 61. Similarly, the n-type semiconductor layer 25 of the light-receiving element 20b is contact to the wiring 40c through the contact layer 61. The contact layer 61 is, for example, made of AuGe/Au. The insulating film 60 covers the surface of the dummy mesas 30a to 30c and covers the semiconductor substrate 10 between the light-receiving elements and the dummy mesas.

The wiring 40a on the lower mesa 21 of the light-receiving element 20a acts as the lower electrode 24 of the light-receiving element 20a. The wiring 40b on the contact layer 28 of the light-receiving element 20a acts as the upper electrode 23 of the light-receiving element 20a. The wiring 40c on the lower mesa 21 of the light-receiving element 20b acts as the lower electrode 24 of the light-receiving element 20b. The wiring 40d on the contact layer 28 of the light-receiving element 20b acts as the upper electrode 23 of the light-receiving element 20b.

Figure 7:
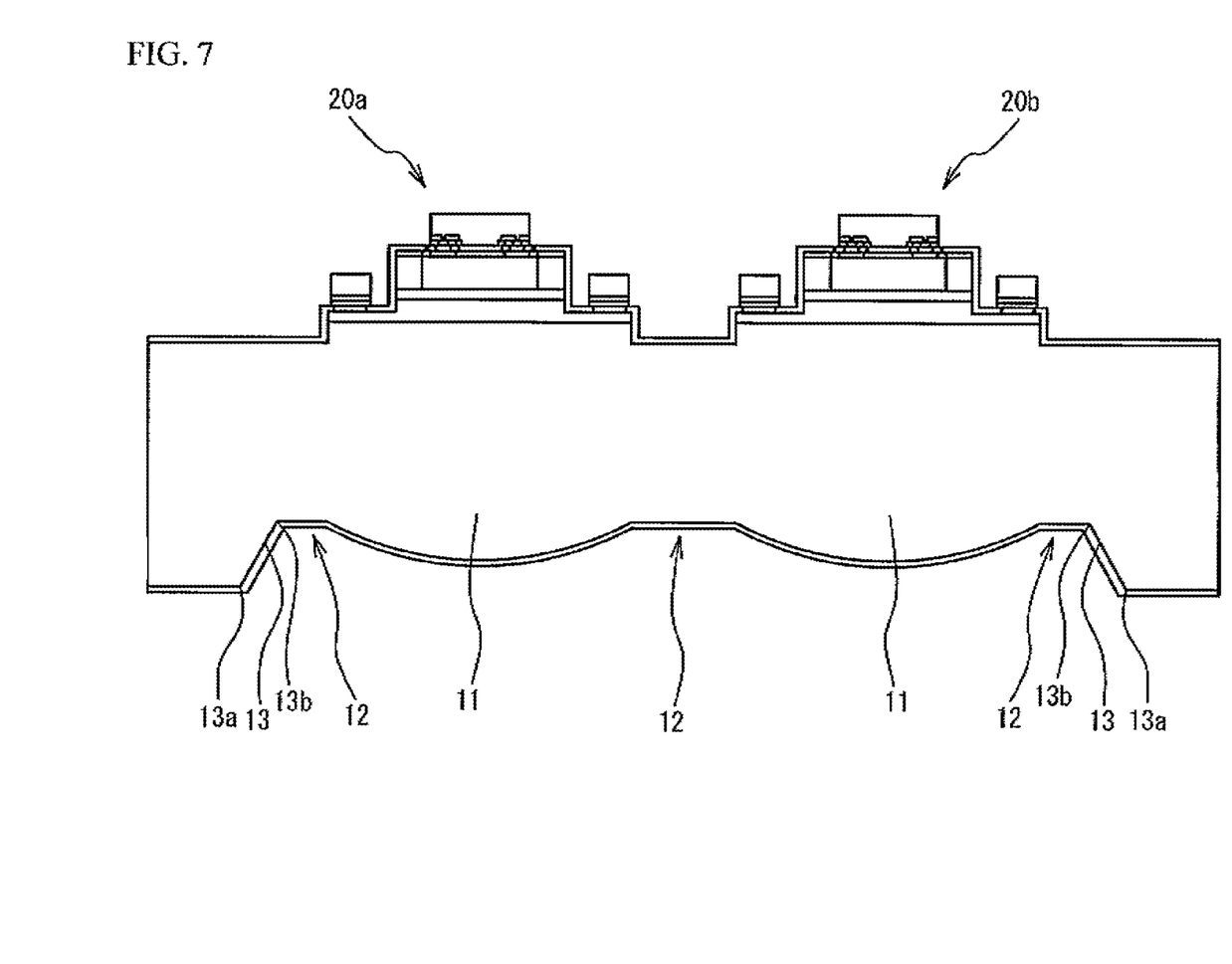
FIG. 7 illustrates a cross sectional view taken along a line D-D of FIG. 5.

FIG. 7 illustrates a cross sectional view taken along a line D-D of FIG. 4. As illustrated in FIG. 7, the light-receiving elements 20a and 20b are adjacent to each other. Therefore, the lens 11 of the light-receiving element 20a is adjacent to another lens 11 of the light-receiving element 20b.

Figure 8A:
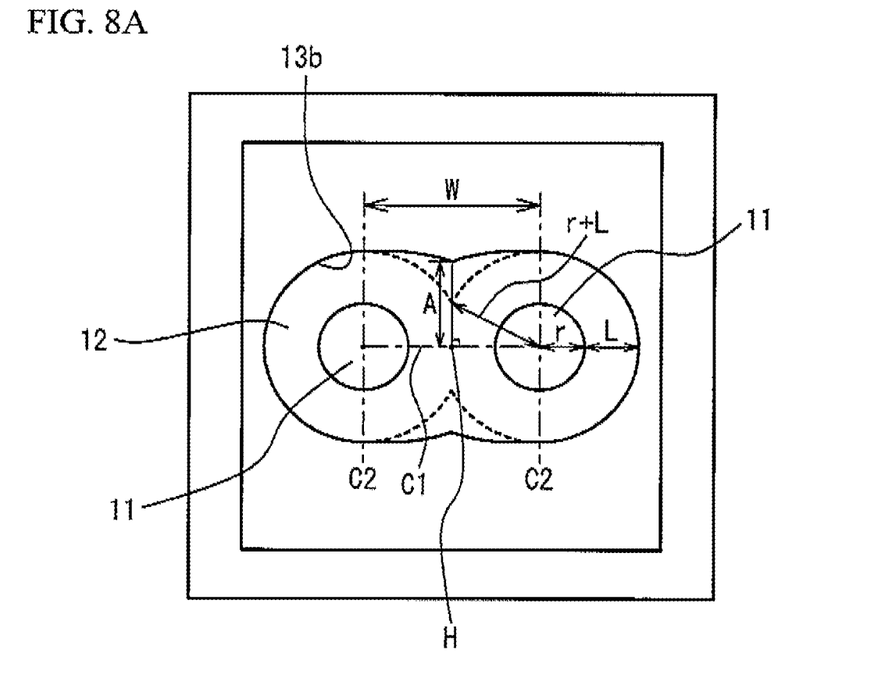
FIG. 8A illustrates a plane view of a back face side of a semiconductor light-receiving device.

FIG. 8A illustrates a plane view of the back face side of the semiconductor light-receiving device 100. The sidewall 13 and the upper edge 13a are omitted in this Figure. A radius of the lens 11 is expressed as a radius "r". The radius "r" is, for example, 20 μm to 40 μm. As an example, the radius "r" is 30 μm. A distance "L" between the lens 11 and the lower edge 13b of the sidewall 13 of the concave region 12 is a clearance for accurately forming the lens 11 by the milling. With the clearance, a milling line with a small incidence angle is sufficiently radiated to the lens 11. A distance between the two lenses 11 is smaller than the radius "r" and the distance "L". Therefore, a whole circumference of the lens 11 is not surrounded by the sidewall 13. That is, the sidewall 13 is not formed between the lenses 11.

In the embodiment, the two light-receiving portions are adjacent to each other. Two circles formed by the sidewalls 13 of the concave regions 12 surrounding the lenses 11 overlap with each other between the two lenses 11. That is, there is no sidewall 13 separating the two lenses 11 between the lenses 11. When a line segment connecting the lens 11 and another lens 11 (a center of the lens 11 and a center of another lens 11) is expressed as a line segment "C1", a length "W" of the line segment "C1" is set to be smaller than 2(r+L). A midpoint of the line segment "C1" is expressed as "H". A line passing a center of the lens 11 at a right angle with the line segment "C1" is expressed as a line "C2". The sidewall 13 is concentrically formed at a position having a distance of "r+L" from the center of the lens 11 in the outside of the region sandwiched by the line C2 of the lens 11 and another line C2 of another lens 11. Thus, the distance "L" is a distance between the lower edge 13b of the sidewall 13 surrounding the lens 11 and the lens 11 at the opposite side of another lens 11. The distance "L" is, for example, 30 μm or more. As an example, the distance "L" is 40 μm.

In the embodiment, as illustrated in FIG. 8A, a length of a line segment connecting a midpoint H of the line segment C1 connecting the lens 11 and another lens 11 (the center of the lens 11 and the center of another lens 11) and the lower edge 13b surrounding each lens 11 at a right angle is expressed as "A". The length "A" is set to be larger than $\{(r+L)^2-(W/2)^2\}^{1/2}$. Therefore, there is no region projecting with a small angle in the concave region 12 between the two lenses 11. Thus, the defect of the insulating film is restrained.

Figure 8B:
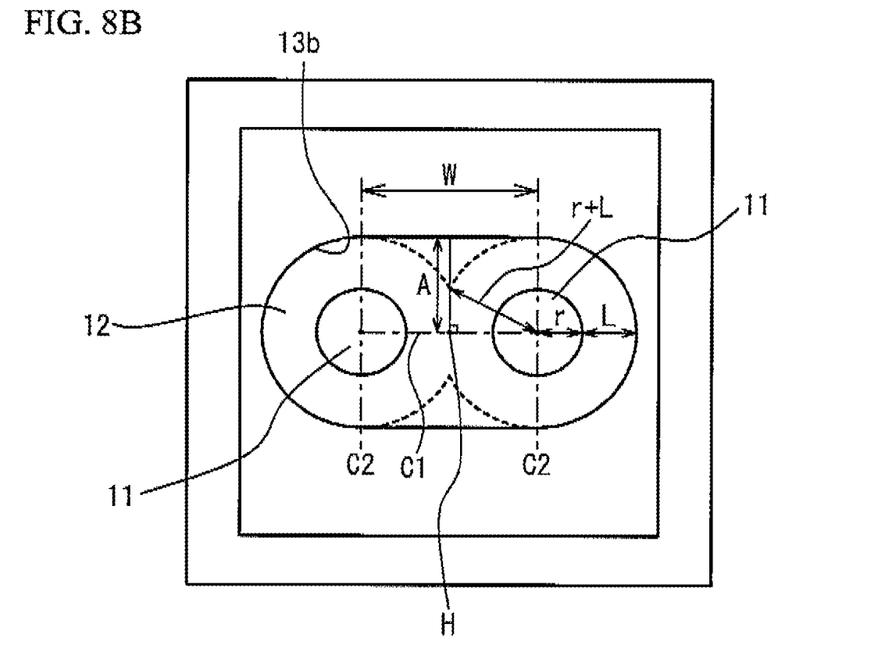
FIG. 8B illustrates another example of the back face of the semiconductor light-receiving device.

FIG. 8B illustrates another example of the back face of the semiconductor light-receiving device 100. As illustrated in FIG. 8B, the lower edge 13b of the sidewall 13 of the concave region 12 surrounding the two lenses 11 may have a straight line shape between the two lenses 11.

Figure 9:
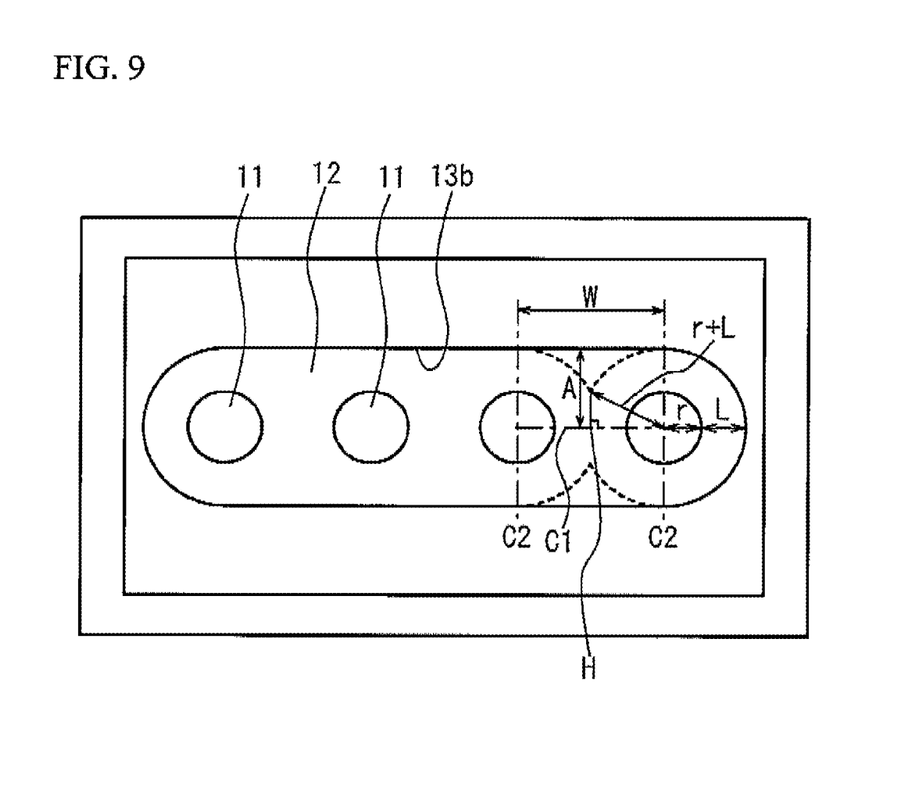
FIG. 9 illustrates a case where four light-receiving elements are aligned in a single row.

FIG. 9 illustrates a case where four light-receiving elements are aligned in a single row. In this case, the length "W" of the line segment C1 connecting the lens 11 and another lens 11 (the center of the lens 11 and the center of another lens 11) is set to be smaller than "r+L". And, the length "A" of the line segment connecting the midpoint "H" of the line segment C1 and the lower edge 13b of the sidewall 13 of the concave region 12 surrounding each lens 11 at a right angle is set to be larger than $\{(r+L)^2-(W/2)^2\}^{1/2}$. Thus, the defect of the insulating film is restrained.

Figure 10A:
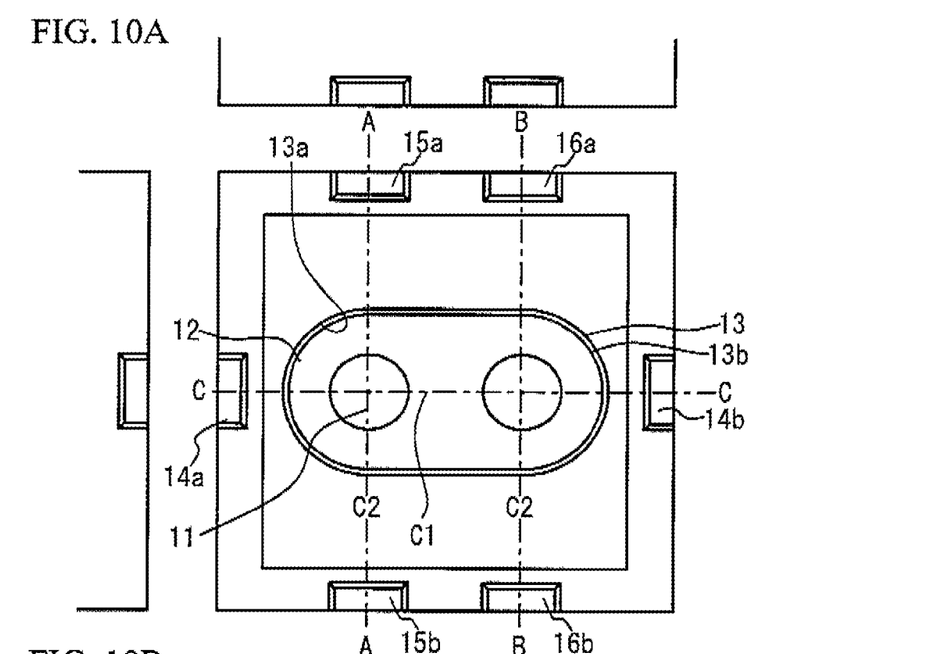
FIG. 10A through FIG. 10C illustrate another example of the back face of the semiconductor device.
Figure 10B:
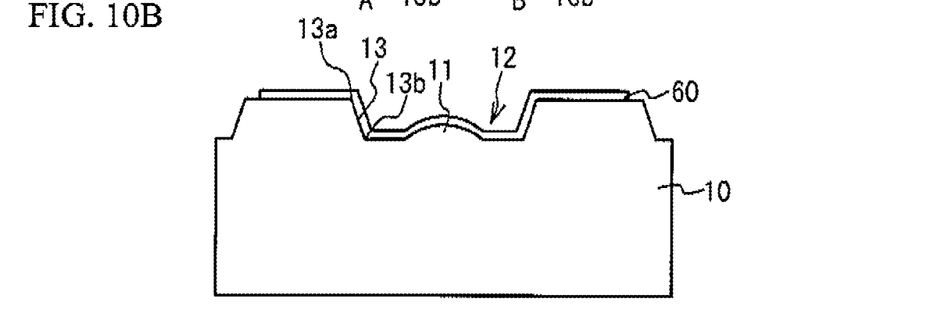
Figure 10C:
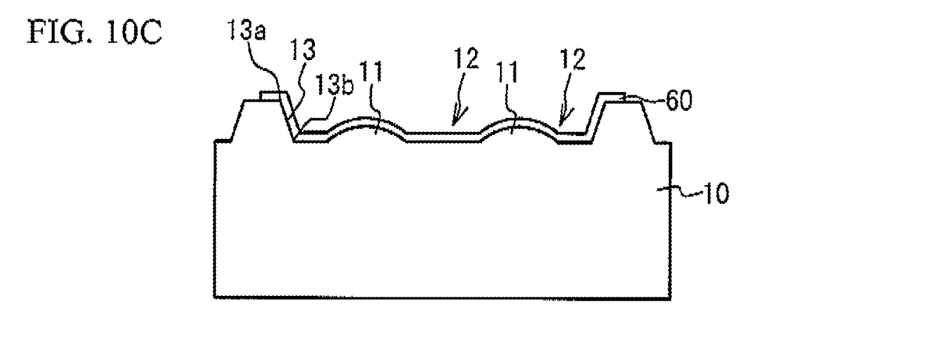

FIG. 10A through FIG. 10C illustrate another example of the back face of the semiconductor light-receiving device 100. FIG. 10A illustrates a plane view of the back face side of the semiconductor light-receiving device 100. FIG. 10B illustrates a cross sectional view taken along a line A-A or a line B-B of FIG. 10A. FIG. 10C illustrates a cross sectional view taken along a line C-C of FIG. 10A.

As illustrated in FIG. 10A and FIG. 10C, a recess 14a is formed on one side of an extended line of the line segment C1 connecting the center of the lens 11 and the center of another lens 11, and a recess 14b is formed on the other side of the extended line. The recesses 14a and 14b are exposed in the side face (a dicing line region) of the semiconductor substrate 10. It is preferable that the recesses 14a and 14b are symmetrically with respect to the extended line of the line segment C1.

As illustrated in FIG. 10A and FIG. 10B, a recess 15a is formed on one side of an extended line of the line C2 passing through the center of the lens 11 at a right angle with respect to the line segment C1, and a recess 15b is formed on the other side of the extended line. A recess 16a is formed on one side of an extended line of the line C2 passing through the center of another lens 11 at a right angle with the line segment C1, and a recess 16b is formed on the other side of the extended line. The recesses 15a, 15b, 16a and 16b are exposed in the side face (the dicing line region) of the semiconductor substrate 10. It is preferable that the recesses 15a, 15b, 16a and 16b are symmetrically with respect to the extended line of the line C2. It is preferable that the recesses 14a, 14b, 15a, 15b, 16a and 16b are formed in a region without the insulating film 60 on the back face of the semiconductor substrate 10.

An angle between a bottom face and a sidewall of the recesses 14a, 14b, 15a, 15b, 16a and 16b should be determined appropriately. When the angle is close to verticality, a trouble such as a defect of crystal or a shortage of resist coverage in a subsequent process tends to occur. When the angle is small, an area of a slope region gets larger in a whole chip. The angle is appropriately determined in view of the reasons. As an example, the angles of the recesses 14a, 14b, 15a, 15b, 16a and 16b are equal to each other.

In the structures of FIG. 10A through FIG. 10C, the center of the lens 11 is positioned at an intersection point of a line connecting the recesses 14a and 14b and a line connecting the recesses 15a and 15b. The center of another lens 11 is positioned at an intersection point of a line connecting the recesses 14a and 14b and a line connecting the recesses 16a and 16b. Therefore, when a positional relation between the recesses 14a, 14b, 15a, 15b, 16a and 16b is detected, it is possible to determine the positions of the lens 11 and another lens 11.

When the recesses 14a and 14b are symmetrically with respect to the extended line of the line segment C1, a line connecting a center of the recess 14a in a width direction and a center of the recess 14b in a width direction overlaps with the line segment C1. When the recesses 15a, 15b, 16a and 16b are symmetrically with respect to the extended line of the line C2, a line connecting a center of the recess 15a in a width direction and a center of the recess 15b in a width direction overlaps with the line segment C2, and a line connecting a center of the recess 16a in a width direction and a center of the recess 16b in a width direction overlaps with another line C2. Therefore, it is possible to determine the positions of the lens 11 and another lens 11 with use of the positional relation of the recesses 14a, 14b, 15a, 15b, 16a and 16b.

A region between the concave region 12 and the recesses 14a, 14b, 15a, 15b, 16a and 16b is not grinded. Therefore, the region is positioned at a higher position than the lens 11 and another lens 11. Therefore, when viewed from each recess, the lens 11 and another lens 11 are out of sight. However, it is possible to determine the positions of the lens 11 and another lens 11, when a position of a mark for position determination and the positions of the recesses 14a, 14b, 15a, 15b, 16a and 16b are matched even if the lens 11 and another lens 11 are out of sight.

Figure 11A:
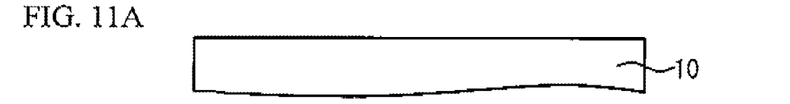
FIG. 11A through FIG. 11H illustrate a forming flow of a lens and a recess.
Figure 11B:
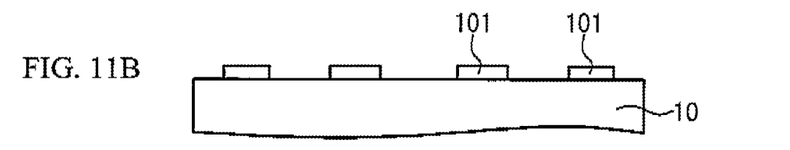
Figure 11C:
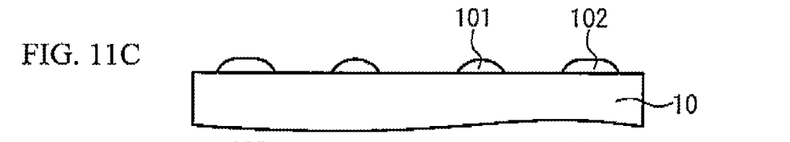

FIG. 11A through FIG. 11H illustrate a forming flow of the lens and the recess. As illustrated in FIG. 11A, the semiconductor substrate 10 is prepared. Next, as illustrated in FIG. 11B, a resist 101 is formed on regions of the lens 11 and another lens 11 and the region between the concave region 12 and the recesses 14a, 14b, 15a, 15b, 16a and 16b on the back face of the semiconductor substrate 10 by performing a photo lithography process. Next, as illustrated in FIG. 11C, the resist 101 is rounded by performing a resist cure process.

Figure 11D:
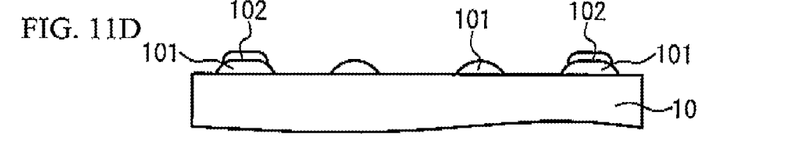
Figure 11E:
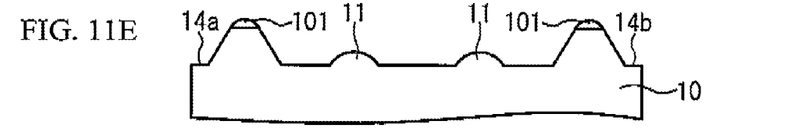

Next, as illustrated in FIG. 11D, a resist 102 is formed on the resist 101 on the region between the concave region 12 and the recesses 14a, 14b, 15a, 15b, 16a and 16b by performing another photo lithography process. Next, as illustrated in FIG. 11E, the exposed region of the resists 101 and 102 is subjected to an etching process such as an ion milling. Thus, the recesses 14a, 14b, 15a, 15b, 16a and 16b are formed. The region of the resist 101 on the lens 11 and another lens 11 are removed. And, the lens 11 and another lens 11 are formed on the back face of the semiconductor substrate 10. On the other hand, a region of the resist 101 on the region between the concave region 12 and the recesses 14a, 14b, 15a, 15b, 16a and 16b remains. In FIG. 11E, the recesses 14a and 14b are illustrated.

Figure 11F:
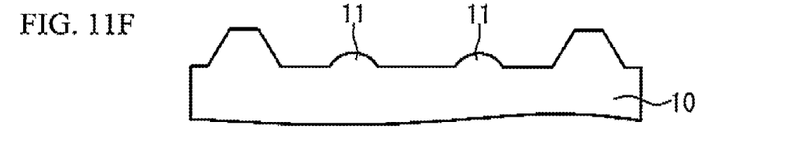
Figure 11G:
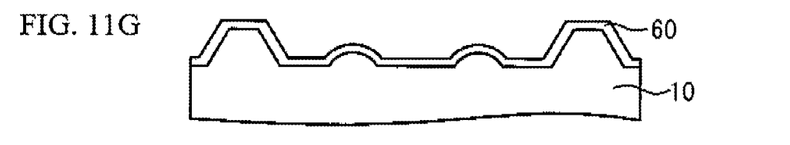
Figure 11H:
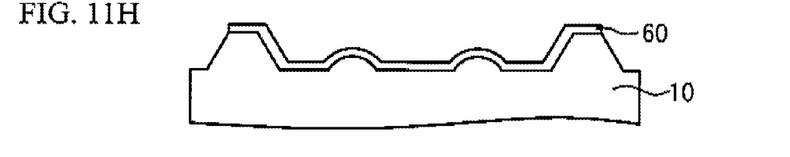

Next, as illustrated in FIG. 11F, the remaining resist 101 is removed. Next, as illustrated in FIG. 11G, the insulating film 60 is formed on the exposed region of the back face of the semiconductor substrate 10. Next, as illustrated in FIG. 11H, the region of the insulating film 60 on the recesses 14a, 14b, 15a, 15b, 16a and 16b are removed by performing a resist coating process, a patterning process and an etching process. Thus, a dicing line region is formed.

Figure 12:
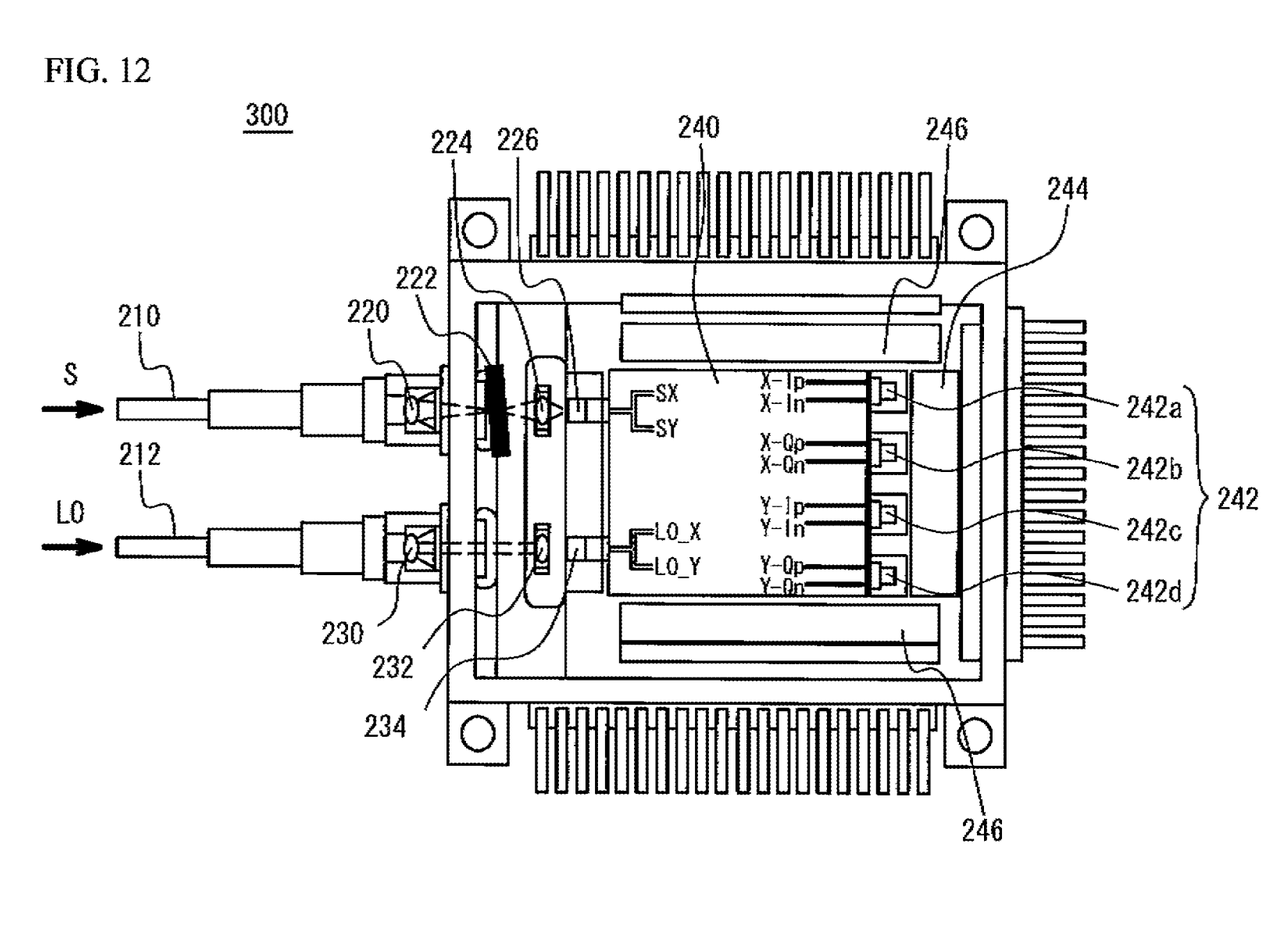
FIG. 12 illustrates an optical receiver on which a semiconductor light-receiving device is mounted.

Next, a description will be given of a mounting of the semiconductor light-receiving device 100. FIG. 12 illustrates an optical receiver 300 on which the semiconductor light-receiving device 100 is mounted. As illustrated in FIG. 12, a first optical fiber 210 for inputting a signal light (S) and a second optical fiber 212 for inputting a local oscillation light (LO) are connected to the optical receiver 300. The optical fibers may be a polarization maintaining optical fiber.

In an optical system connected to the first optical fiber 210, a first lens 220, a VOA 222, a second lens 224, and a PBS 226 are arranged in this order from the first optical fiber 210 side. The first lens 220 and the second lens 224 are a collecting lens. The VOA (Variable Optical Attenuator) 222 is an example of an optical attenuator that is capable of changing a pass amount of a light, and adjusts a light amount of a signal light reaching the second lens 224 from the first lens 220. The PBS (Polarizing Beam Splitter) 226 disperses the signal light (S) into a polarized wave (SX) in an X-direction and a polarized wave (SY) in a Y-direction. The dispersed signal light is input into an optical hybrid 240.

In an optical system connected to the second optical fiber 212, a third lens 230, a fourth lens 232 and a BS 234 are arranged in this order from the second optical fiber 212 side. The BS (Beam Splitter) 234 disperses the oscillation light (LO) having passed through the third lens 230 and the fourth lens 232 into a polarized wave (LO_X) and a polarized wave (LO_Y). The dispersed oscillation light is input into the optical hybrid 240.

The optical hybrid 240 is an optical circuit for delaying, dispersing and combining an input light, and is structured with a quartz-based PLC (Planar Lightwave Circuit) or the like. The signal light SX is combined with the oscillation lights LO_X and LO_Y by the optical hybrid 240. After that, the signal light SX is divided into an In-Phase component I and a Quadrature component Q, and is output as an optical signal X-Ip, an optical signal X-In, an optical signal X-Qp and an optical signal X-Qn. The signal light SY is combined with the oscillation lights LO_X and LO_Y by the optical hybrid 240. After that, the signal light SY is divided into an In-phase component I and a Quadrature component Q, and is output as an optical signal Y-Ip, an optical signal Y-In, an optical signal Y-Qp and an optical signal Y-Qn. The "p" and "n" respectively means positive and negative. For example, The X-Ip means an output signal light of a positive component of the In-Phase component of the signal light SX.

Optical detection portions 242a to 242d including a photodiode and a trans-impedance amplifier are provided across the first lens 220 and the second lens 224 from the optical hybrid 240. Interconnection substrates 244 and 246 are provided around the optical hybrid 240.

Figure 13:
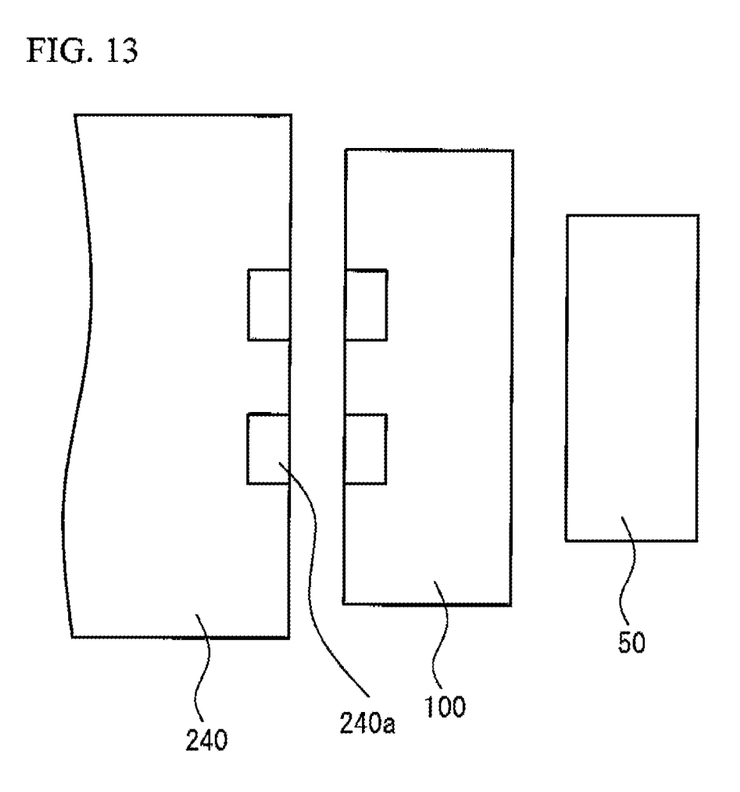
FIG. 13 illustrates an enlarged view of an optical detection portion.

FIG. 13 illustrates an enlarged view of the optical detection portions 242a to 242d. As illustrated in FIG. 13, the optical detection portions 242a to 242d have a TIA 50 and the semiconductor light-receiving device 100. A recess 240a is formed as a mark at a position where the optical hybrid 240 faces with the back face of the semiconductor light-receiving device 100. It is possible to match the position of a waveguide of the optical hybrid 240 and the position of the light-receiving element 20 of the semiconductor light-receiving device 100, when the position of the recesses 14a, 14b, 15a, 15b, 16a and 16b are determined with use of the recess 240a as a mark. When the lens 11 is located between the optical hybrid 240 and the light-receiving element 20, an active alignment can be achieved.

The present invention is not limited to the specifically disclosed embodiments and variations but may include other embodiments and variations without departing from the scope of the present invention.

What is claimed is:

1. A semiconductor light-receiving device comprising:
two lenses provided on a semiconductor substrate; and
a concave region surrounding the two lenses,
a sidewall positioned along an edge of the concave region having an upper edge and a lower edge,
a height of the sidewall being higher than a top of the lenses,
a distance between a position H and the lower edge of the sidewall in a direction vertical to a line segment C1 being grater than following condition (1):

$$\{(r+L)^2-(W/2)^2\}^{1/2} \qquad (1)$$

where:
C1 is a line segment connecting centers of the two lenses;
H is a midpoint of the line segment C1;
r is a radius of the lenses;
W is an interval between the centers of the two lenses; and
C2 is a lines passing through the centers of the lenses in a direction vertical to the line segment C1,
wherein;
the lower edge of the concave portion in an outer side of a region between the lines C2 is concentrically formed so as to have a distance of (r+L) from the center of the lenses; and
W is following condition (2):

$$W<2(r+L) \qquad (2).$$

2. The semiconductor light-receiving device as claimed in claim 1, wherein a distance L between the sidewall of the concave region and an outer circumference of the lens is a distance between an outer circumference of the lens and the sidewall in a concentric circle formed by the sidewall with the lens according to the sidewall.

3. The semiconductor light-receiving device as claimed in claim 1, wherein the two lenses are formed in a circle shape.

4. The semiconductor light-receiving device as claimed in claim 1, wherein the sidewall has a straight line shape between the two lenses.

5. The semiconductor light-receiving device as claimed in claim 1, wherein a material of the lens is InP.

6. The semiconductor light-receiving device as claimed in claim 1, wherein a material of the sidewall is the same as the material of the lenses.

7. The semiconductor light-receiving device as claimed in claim 1, wherein the two lenses are aligned in a row.

8. The semiconductor light-receiving device as claimed in claim 1, wherein:
the radius r of the lenses is 20 μm to 40 μm; and
a distance L between the lenses and the sidewall is 30 μm or more.

9. The semiconductor light-receiving device as claimed in claim 1, wherein a recess is formed on an extended line of the line segment C1 and an extended line of the line C2 in a region other than the regions of the lenses and the concave region of the semiconductor substrate.

10. The semiconductor light-receiving device as claimed in claim 9, wherein the recess have a symmetrical shape with respect to the extended line.

11. An optical semiconductor device comprising:
a semiconductor substrate having an upper face and a lower face;
an active region provided on a side of the upper face of the substrate;
two lenses provided on a side of the lower face of the substrate; and
a concave region surrounding the two lenses,
a sidewall positioned along an edge of the concave region having an upper edge and a lower edge,
a height of the sidewall being higher than a top of the lenses, a distance between a position H and the lower edge of the sidewall in a direction vertical to a line segment C1 being grater than following condition (1):

$$\{(r+L)^2-(W/2)^2\}^{1/2} \quad (1)$$

where:
C1 is a line segment connecting centers of the two lenses;
H is a midpoint of the line segment C1;
r is a radius of the lenses;
W is an interval between the centers of the two lenses; and
C2 is a lines passing through the centers of the lenses in a direction vertical to the line segment C1,
wherein:
the lower edge of the concave portion in an outer side of a region between the lines C2 is concentrically formed so as to have a distance of (r+L) from the center of the lenses; and
W is following condition (2):

$$W<2(r+L) \quad (2).$$

12. The optical semiconductor device as claimed in claim 11, wherein the active region includes a light-receiving region or a light-emitting region.

* * * * *